US012656435B2

(12) United States Patent
Speier et al.

(10) Patent No.: US 12,656,435 B2
(45) Date of Patent: Jun. 16, 2026

(54) METHOD FOR DETECTION OF A NUMBER OF PILOT TONE SIGNALS, MAGNETIC RESONANCE APPARATUS, AND COMPUTER PROGRAM PRODUCT

(71) Applicant: Siemens Healthineers AG, Forchheim (DE)

(72) Inventors: Peter Speier, Erlangen (DE); Jan Bollenbeck, Eggolsheim (DE); Mario Bacher, Diepersdorf (DE)

(73) Assignee: Siemens Healthineers AG, Forchheim (DE)

( * ) Notice: Subject to any disclaimer, the term of this patent is extended or adjusted under 35 U.S.C. 154(b) by 295 days.

(21) Appl. No.: 18/611,035

(22) Filed: Mar. 20, 2024

(65) Prior Publication Data

US 2024/0329172 A1 Oct. 3, 2024

(30) Foreign Application Priority Data

Mar. 28, 2023 (DE) .......................... 102023202842.5

(51) Int. Cl.
*G01R 33/54* (2006.01)
(52) U.S. Cl.
CPC .................................. *G01R 33/54* (2013.01)
(58) Field of Classification Search
CPC .............. G01R 33/54; G01R 33/56509; G01R 33/5673; G01R 33/362
USPC ....................................................... 324/309
See application file for complete search history.

(56) References Cited

U.S. PATENT DOCUMENTS

| | | | | |
|---|---|---|---|---|
| 12,423,818 B2 * | 9/2025 | Huang | .................. | A61B 5/113 |
| 2008/0204027 A1 * | 8/2008 | Luedeke | ............ | G01R 33/3692 |
| | | | | 324/322 |
| 2009/0267601 A1 * | 10/2009 | Van Helvoort | .... | G01R 33/3415 |
| | | | | 324/309 |
| 2016/0245888 A1 | 8/2016 | Bollenbeck | | |
| 2017/0160364 A1 | 6/2017 | Fenchel | | |
| 2018/0172784 A1 * | 6/2018 | Brunner | ................ | A61B 34/20 |

(Continued)

FOREIGN PATENT DOCUMENTS

| | | |
|---|---|---|
| DE | 112020002457 T5 | 3/2022 |
| EP | 3742184 A1 | 11/2020 |
| WO | 2018173009 A1 | 9/2018 |

*Primary Examiner* — Christopher P McAndrew
(74) *Attorney, Agent, or Firm* — Lempia Summerfield Katz LLC

(57) ABSTRACT

A method for detection of a number of pilot tone signals, a magnetic resonance apparatus, and a computer program product are disclosed. The method includes receiving receive signals according to an MR sequence by an RF receive unit of an MR apparatus, wherein the receive signals include an MR signal and the number of PT signals. The number of PT signals each have a different pilot tone frequency. The number of PT signals are received according to the MR sequence in a number of PT receive time segments having a duration of at least $t_m$, interrupted by pauses. The method further includes digitizing the receive signals by sampling with a first sampling frequency $f_1$ and detecting the number of PT signals from the digitized receive signals by sampling the digitized receive signals with a second sampling frequency $f_2$, wherein the second sampling frequency $f_2 \geq 2/t_m$.

18 Claims, 7 Drawing Sheets

(56)  References Cited

U.S. PATENT DOCUMENTS

| | | | | |
|---|---|---|---|---|
| 2018/0353139 A1* | 12/2018 | Speier | .................... | A61B 5/055 |
| 2018/0353140 A1* | 12/2018 | Speier | .................... | A61B 5/055 |
| 2019/0377051 A1* | 12/2019 | Bacher | ............. | G01R 33/56509 |
| 2020/0375463 A1 | 12/2020 | Hess et al. | | |
| 2022/0206098 A1 | 6/2022 | Leussler et al. | | |
| 2022/0230318 A1* | 7/2022 | Huang | ................... | A61B 5/113 |
| 2022/0361822 A1 | 11/2022 | Speier | | |

* cited by examiner

| | |
|---|---|
| Obtain receive signals | S10 |
| Digitize receive signals | S20 |
| Detect PT signals | S30 |
| Create interpolation data | S40 |
| Filter out signal peaks | S50 |
| Separate PT signals | S60 |

1

METHOD FOR DETECTION OF A NUMBER OF PILOT TONE SIGNALS, MAGNETIC RESONANCE APPARATUS, AND COMPUTER PROGRAM PRODUCT

The present patent document claims the benefit of German Patent Application No. 10 2023 202 842.5, filed Mar. 28, 2023, which is hereby incorporated by reference in its entirety.

TECHNICAL FIELD

The disclosure relates to a method for detection of a number of pilot tone signals, to a magnetic resonance apparatus and to a computer program product.

BACKGROUND

In medical engineering, imaging by magnetic resonance (MR), also called Magnetic Resonance Tomography (MRT) or Magnetic Resonance Imaging (MRI), is characterized by high soft tissue contrast. A patient may be positioned in a static, homogeneous magnetic field of an MR apparatus. During an MR measurement, in accordance with an MR sequence, e.g., with the help of a radio frequency antenna unit of the MR apparatus, radio frequency (RF) transmit pulses are radiated into the patient. Nuclear spins are excited by the transmit pulses generated in conjunction with the static magnetic field in the patient, whereby spatially encoded MR signals are triggered by gradient pulses. The MR signals are received by a radio frequency receive unit of the MR apparatus and are used for reconstruction of MR images.

In order to obtain a higher quality of the MR images, movement data may be recorded during the MR measurement, which describes a possible movement of the patient. With the aid of the data, a prospective or retrospective movement correction may be undertaken. Movement data may further be used for a control, e.g., synchronization, of the MR sequence with the patient movement.

A technique for acquisition of movement data has been introduced in recent years, which employs a pilot tone (PT) and is described, for example, in U.S. Patent Application Publication No. 2016/0245888 A1, U.S. Patent Application Publication No. 2017/0160364 A1, and U.S. Patent Application Publication No. 2018/0353139 A1. In this technique, a PT generator is used to send out a PT signal, which is modulated by a movement of the patient and is received by the RF receive unit of the MR apparatus. Advantageously, the RF receive unit has a receive bandwidth that is large enough simultaneously to receive the MR signal and PT signal that does not lie in the frequency range of the MR signal.

In U.S. Patent Application Publication No. 2022/0361822 A1, a number of PT signals may be sent in parallel. In this case, signal characteristics, (e.g., frequency, phase, and/or amplitude), of the PT signals created in parallel are individually modulated. A parallel transmit system (pTx system) is needed here, however, which brings with it a high outlay in hardware.

SUMMARY AND DESCRIPTION

An object of the present invention may include detecting a number of PT signals that may be distinguished from one another, in particular signals that do not disrupt the MR signal, in order to obtain even better movement information.

The scope of the present disclosure is defined solely by the appended claims and is not affected to any degree by the statements within this summary. The present embodiments may obviate one or more of the drawbacks or limitations in the related art.

A method, (e.g., computer-implemented method), for detection of a number of PT signals is proposed. In the method, (e.g., during an MR measurement) receive signals in accordance with an MR sequence are received by an RF receive unit of an MR apparatus. In this case, the receive signals comprise an MR signal and a number of PT signals. The number of PT signals each have a different pilot tone frequency, in particular mid frequency, $f_{PTj}$. The number of PT signals are received according to the MR sequence in a number of PT receive time segments interrupted by pauses, each PT receive time segments having a duration $t_m$. The PT receive time segments interrupted by pauses are in particular defined by the MR sequence. The receive signals are digitized by sampling them with a first sampling frequency $f_1$. The number of PT signals are detected from the digitized receive signals by sampling of the digitized receive signals with a second sampling frequency $f_2$, wherein the following applies for the second sampling frequency $f_2$: $f_2 \geq 2/t_m$. In certain examples, $f_2 \geq 4/t_m$ applies.

In the following, the terms "sampling frequency" and "sampling rate" are equivalent. A sampling frequency is specified in the unit "Hz," a sampling rate in the unit "S/s" (Samples per second). A sampling of a signal with a sampling frequency of x Hz thus corresponds to a sampling of the signal with a sampling rate of x S/s.

The frequencies of the receive signals may be converted before their digitization with a frequency mixer. The digitized, (e.g., real), receive signals may be converted by multiplication by a signal, in particular by a quadrature signal, in particular by an $f_1/4$ sine/cosine signal, in an, in particular half-complex, frequency mixer, so that the frequencies of the number of PT signals are arranged in the vicinity of 0 Hz. In particular, the digitized receive signals are converted so that they are arranged spectrally symmetrically about 0 Hz.

A possible further processing of the number of PT signals may be undertaken with a detection bandwidth $B_D \leq f_2$. Advantageously deconvolution artifacts may be reduced by this.

For the case in which the respective durations $t_m$ of the number of PT recording time segments differ from one another, i.e., are not constant, the shortest duration $t_m$ of these differing durations $t_m$ may be used for the condition $f_2 \geq 2/t_m$ or $f_2 \geq 4/t_m$. The method may include an establishing of this shortest duration $t_m$ of the number of PT recording time segments.

Advantageously, the number of PT signals is sampled a number of times during each PT receive time segment of the duration $t_m$. Advantageously, a corresponding sampling interval (dwell time) $T_D = 1/f_2$ is significantly smaller than $t_m$. If, for example, a sampling interval of $T_D = t_m/4$ is selected, then at least three sampling values lie in the PT receive time segment of the duration $t_m$. If, for example, $t_m = 2$ ms applies, then $T_D = 0.5$ ms or a second sampling frequency of $f_2 = 1/T_D = 2$ kHz is produced. With a sampling frequency of $f_2 = 2$ kHz, a bandwidth of 1 kHz may advantageously uniquely be mapped, or 2 kHz for more complex-value processing.

The second sampling frequency $f_2$ is advantageously determined by the minimum duration $t_m$ of the number of PT recording time segments to be expected. $B_D \leq f_2/2$ or $B_D \leq f_2$ may then be produced from the sampling frequency for the detection bandwidth for complex value processing. In particular the detection bandwidth $B_D$ (for a sensible number j of PT generators or PT frequencies $f_{PT}$, for example, j≤5) is not determined by the sum bandwidth of the PT signals.

The second sampling frequency $f_2$ may be smaller than the first sampling frequency $f_1$ with which the receive signals are sampled during the digitization. Through this, the number of pilot tone signals detected may be further processed with a lower bandwidth, and thus lower outlay, in particular computing outlay. This advantageously allows a use of more low-cost components, in particular hardware components, in the MR apparatus.

Advantageously, the second sampling frequency $f_2$ is chosen so that PT signals may be detected reliably, in particular when the receipt of the receive signals including the PT signals is constantly interrupted by pauses. Such an interruption may be caused by the RF receive unit of the MR apparatus being detuned during a sending of an RF send pulse, for example, an excitation or refocusing pulse. Such RF send pulses may be sent out regularly in accordance with the MR sequence, for example, at an interval of 3 ms. The interruption may last for 1 ms, for example, so that the PT recording time segment is 3−1=2 ms long. If the durations of the PT recording time segments differ during the MR sequence, the shortest duration is advantageously chosen in order to provide that a (usable) PT signal is detected even for this (shortest) PT recording time segment.

The detection of the number of PT signals from the receive signals may also include a conversion of the receive signals and/or extraction of the number of PT signals from the receive signals and/or detection of the number of PT signals. For example, the receive signal received by the RF receive unit of an MR apparatus may be digitized with a first sampling frequency $f_1$ of 10 MHz. For an assumed (in particular shortest) PT recording time segment $t_m$ of 2 ms, $f_2 \geq 1$ kHz applies for the second sampling frequency (in order to fulfil the condition $f_2 \geq 2/t_m$) or $f_2 \geq 2$ kHz (in order to fulfil the condition $f_2 \geq 4/t_m$). It is thus guaranteed that the time between the detection points, in particular sampling points, is small enough to detect valid PT signals. Advantageously, through a sufficiently high second sampling frequency $f_2$, possibly more complex measures, such as a synchronization of the creation of the PT signals with the application of the MR sequence, may be dispensed with.

For creation of PT signals, RF signals may be created with a PT generator, which interact with the patient. A coil element of an RF receive unit receiving the PT signal may in particular be a part of a coil, in particular of a local coil and/or of a body coil installed at a fixed position in the magnetic resonance apparatus. A coil element receiving the PT signal may be suitable for transmitting the received PT signal to establish movement information of the patient, in particular for evaluation of information about a physiological process in the patient and/or a movement of the patient, to a system control unit of the MR apparatus.

By way of example the PT generator may be part of a local coil, in particular may be integrated and/or installed into a local coil. Advantageously, the number of RF signals is created by PT generators, which are placed at different points. For example, a first PT generator is placed above the heart of the patient (for example, in a local coil such as a flexible local coil, which is arranged on the patient), and a second PT generator is placed beneath the heart of the patient (for example, in a spinal cord coil).

The distributed arrangement of the PT generators advantageously enables it to be achieved that the modulations impressed on the number of PT signals may also contain different information and/or the same information (for example, heart movement) in a different way (and thus advantageously be encoded more accurately).

At least one part of the number of PT generators may be placed close to the moving organ such as the heart, for example. Advantageously, the RF signals that are sent out by such PT generators placed close to the organ have a high amplitude at the organ, so that the movement of the organ modulates the received PT signal correspondingly strongly.

Advantageously, this enables the PT generator to be placed especially close to the patient, so that the pilot tone signals received by the coil elements advantageously exhibit an especially high SNR.

The PT signals may lie in one PT frequency range, wherein the RF receive unit, in particular a receiving coil element of the RF receive unit, is embodied to accept a receive frequency range that includes the PT frequency range. The MR apparatus may include a radio frequency antenna unit configured to output an RF pulse to be output, which lets an MR signal arise through magnetic resonance in the body of the patient. The RF receive unit, in particular the receiving coil elements of the receive unit, may be configured to receive the MR signal, wherein the MR signal lies in an MR frequency range that lies at least outside of the PT frequency range. Advantageously, the PT frequency range does not overlap with the actual measurement signal, the MR signal, which lies in the MR frequency range.

Each of the number of PT signals may be first sent out by its own PT generator. In this case, the PT signal sent out may originally have a very low bandwidth, i.e., the PT signal sent out may be similar to a pure and/or continuous sine wave signal. Through interaction with the patient, for example, the PT signal sent out may be changed, so that its bandwidth may also change. The PT signal received by the radio frequency receive unit may have a different shape, in particular a different bandwidth, from the PT signal sent out. Movement information of the patient may advantageously be derived from this change.

The RF receive unit for receipt of the receive signals may include one or more local coils and/or a body coil installed in particular permanently in the MR apparatus. The detection of the number of PT signals with the aid of the receive signals may be carried out in particular by a hardware component of the MR apparatus provided separately for this purpose. Such a hardware component may in particular include one or more FPGAs (Field Programmable Gate Array); a program, which may be referred to as firmware or loadware, may be executed on the FPGAs.

The number of PT signals detected may be further processed by possible processing components, in particular software components. These software components may in particular be executed on General-Purpose Processors (GPP) or General-Purpose computers.

In particular, the number of PT signals are able to be distinguished from one another. The distinguishability may be conditional on the number of PT signals each having a different mid frequency. The mid frequencies may be spaced so far apart from one another that no (significant) overlapping of the frequency spectra of the number of PT signals is produced. The limits of the detection bandwidth $B_D$ may be chosen so that the frequency spectra of the number of PT signals lie within the detection bandwidth $B_D$.

The mid frequency of a signal may be a geometrical or arithmetic mean of frequencies, at which frequencies the amplitude in the frequency spectrum has a predetermined fall, for example, −3 dB- or −6 dB, compared to the maximum of the frequency spectrum.

The mid frequency of a signal may be the frequency at which the frequency spectrum is at its maximum.

The number of pilot tone signals corresponding to the MR sequence may be received, together and/or at the same time, in a number of PT receive time segments interrupted by pauses. The pauses are predetermined by the MR sequence, for example, by the periods of time in which an RF pulse is output by the MR apparatus.

The following may apply for the second sampling frequency $f_2$: $f_2 \leq 80/t_m$, $f_2 \leq 40/t_m$, or $f_2 \leq 20/t_m$.

Advantageously, the second sampling frequency $f_2$ is chosen so that a high level of detection efficiency of the PT signals is provided. The first and/or the last sampling value in a PT receive time segment may possibly be lost. This loss may advantageously be reduced through a higher second sampling frequency $f_2$.

By the restriction of the second sampling frequency $f_2$ upwards, lower technical demands are imposed on a possible subsequent further processing of the acquired PT signals. Thus, simpler and/or more low-cost hardware for detection of the number of PT signals from the receive signals may be employed. Advantageously, a detection of a number of (distinguishable) PT signals may be carried out with the same hardware, which is also employed for a detection of just one PT signal. Advantageously, the detection bandwidth $B_D$ is large enough for detecting all relevant movement information of the PT signals.

One form of embodiment of the method for detection of the number of PT signals makes provision for the MR signal to lie in an MR frequency range $f_{MR} + \Delta f_{MR}$, and for the number of pilot tone-frequencies $f_{PTj}$ to have a maximum spacing from one another of $\Delta f_{PT,max}$, wherein the number of pilot tone frequencies $f_{PTj}$ for the MR frequency range $f_{MR} + \Delta f_{MR}$ have a minimum spacing of $\Delta f_{PT\text{-}MR}$.

In particular, the MR signal has frequencies that lie within the MR frequency range. In particular, the MR signal has a frequency distribution that lies within the MR frequency range. The limits of the frequency distribution may be given by frequency points in which the amplitude of the MR signal in relation to a maximum amplitude of the MR signal has fallen to a predetermined value, for example, −6 dB. The MR frequency range $f_{MR} \pm \Delta f_{MR}$ may be expressed as the MR receive band.

What may advantageously be achieved by this is that intermodulation products of the PT signals potentially occurring, which would fall spectrally into the MR frequency range, have such a high order that their levels are already sufficiently low so that there is no fear of artifacts from this.

Possible uncompensated nonlinearities in the MR receive system that may create harmonics of the PT signals. A harmonic of a base signal may have a whole-number multiple frequency of the frequency of the base signal. The frequencies of the PT signals may advantageously be chosen so that the deconvolution products of the harmonics of the PT signals arising in the sampling that have a high amplitude do not fall into the MR frequency range, but in any event only deconvolution products of high-order harmonics, e.g., with a lower amplitude. Convolution artifacts may thus be reduced.

In particular, it is proposed that the MR signal lies in an MR frequency range $f_{MR} \pm \Delta f_{MR}$, wherein the number of pilot tone frequencies $f_{PTj}$ have a maximum spacing of $\Delta f_{PT,max}$ from one another, wherein the number of pilot tone frequencies $f_{PTj}$ have a minimum spacing of $\Delta f_{PT\text{-}MR}$ to the MR frequency range $f_{MR} \pm \Delta f_{MR}$, wherein the following applies: $\Delta f_{PT,max} < 2 * \Delta f_{PT\text{-}MR}/n_{max}$, wherein $n_{max} = 80$, 90, or 100.

Advantageously, the method further makes provision for a separation of the number of PT signals by a filter that is tolerant as regards gaps in the signal, and in particular is suitable for interpolating over signal gaps. The method may further provide for a separation of the number of PT signals by a bandpass filter and/or a lowpass filter in each case. The bandpass filter and/or a lowpass filter may have an identical characteristic for all PT signals to be separated. Before the use of a lowpass filter the PT signals may each be spectrally symmetrically shifted by 0 Hz, i.e., a frequency conversion takes place. The frequency conversion may include a mixing into the same band, e.g., into the baseband, shifted by 0 Hz. The one bandpass filter and/or lowpass filter in each case may have a width of less than 100 Hz.

The number of PT signals may be separated into a respective single PT signal. In particular, each of these separated PT signals have serve as a separate PT receive channel for a further processing of the PT signals, such as for computation and application of channel combination coefficients and/or subtraction of signal spikes, which for example has been learned in a training.

The one bandpass filter or lowpass filter respectively of one of the number of PT signals may have a pass band, at least one blocking band, and at least one transition band between the pass band and the at least one blocking band, wherein the at least one blocking band overlaps with the at least one frequency spectrum of the at least one other PT signal. In a filtered PT signal, this enables the signal components of other PT signals to be suppressed.

The transition band of the respective one bandpass filter or lowpass filter may have a bandwidth that is suitable for detecting the (relevant) movement information of the patient. In an MR measurement, the physiological frequency content may be generated by the moving masses, which may have a bandwidth of just a few Hz, for example, of less than 0.5 Hz, for a breathing movement and of less than 6 Hz for a heart movement. Thus the respective PT signal may be filtered with a narrow bandpass or lowpass, in particular with a narrow pass band, with a width of less than 100 Hz, for example, 10 Hz (for the breathing movement) or 50 Hz (for the heart movement).

Starting, for example, from a bandwidth of a PT receive signal of ±6 Hz for a heart movement, the number of pilot tone frequencies $f_{PTj}$, in particular of their mid frequencies, may be arranged spectrally at spacings of 12 Hz. The number of PT signals may be separated from one another by digital bandpass filtering and/or frequency conversion with subsequent lowpass filtering. With decreasing bandwidth of the filter, the time delay introduced by the filter may increase. The pass band may have a width of 100 Hz or ±50 Hz, wherein the frequency spacings of the PT signals are chosen as greater than 100 Hz. With a detection bandwidth of, for example, 2 kHz, complex-value processing and taking possible filter edges into consideration, 1.5 kHz (±750 Hz) may be available, in which, for example, 15 complex-value PT signals may be arranged spectrally.

The method may further include an interpolation over the pauses interrupting the PT receive time segments of the receipt of the number of PT signals. In particular, when the PT signals only vary slowly by comparison with the pauses, an interpolation may be undertaken particularly effectively. To this end, a Kalman filter may be employed.

This may include the separation and/or the interpolation of an application of a Kalman filter, in particular, of an extended Kalman filter, a switching Kalman filter, or an unscented Kalman filter, and/or of a particle filter.

The method for detection of a number of PT signals may further include establishing movement information from the number of PT signals detected, in particular after separation and/or interpolation of the PT signals. Advantageously, the movement information and/or the separation and/or interpolation of the PT signals are established in real time during an MR measurement carried out in accordance with the MR sequence. In this case, "in real time" is characterized in particular by a processing time, which only causes a small time delay, for example, a time delay not perceptible or barely perceptible for an operator of the MR apparatus and/or insignificant for a prospective control of the MR measurement.

The movement information established may be used for the control of the MR measurement (for example, within the framework of a prospective movement correction). The movement information may further be employed within the framework of a retrospective movement correction.

The separation and the interpolation may be undertaken jointly by application of a Kalman filter. For this combined separation and interpolation, a Kalman filter may be applied, in particular as a lowpass filter to complex data values.

The application of a Kalman filter as lowpass filter may include an application of a measurement noise covariance, which is a variance to be expected of the measured signal, here of the PT signals, as filter parameters. The higher the covariance selected; the less trust is attributed to an individual sampled value of the PT signal. In particular, a value deviating strongly from the expected signal shape through noise on application of the Kalman filter only has a low weighting. A further possible filter parameter is the process noise covariance; if a low value is selected for this the model parameters may only change slowly. These two factors bring about a lowpass characteristic, because both the model parameters may only change slowly and also sampling values affected by noise have less influence on the determination of parameters.

A Kalman filter parameterized with a constant-velocity signal model may be used. For example (such as after a frequency conversion), a first PT signal at a frequency of 0 Hz and a second PT signal at a frequency of $\Delta f_{PT}$ ($\Delta f_{PT}$ here is thus the frequency spacing between the first and second PT signal) may be taken into account by multiplication of the constant-velocity signal model by exp $(-i*\Delta f_{PT})$.

J PT signals may further be described as a harmonic signal of a frequency that is fixed and is known a-priori, onto which the (physiological) movement information is modulated in offset and amplitude. The J different PT frequencies produce a sum signal, in which each frequency j is modulated in offset and amplitude. This is able to be represented, for example, by the following model:

$$PT_j = A_j(t) + B_j(t) \cdot \sin(2\pi \cdot f_{PTj} \cdot t)$$

Here, J is the number of PT signals each with a different frequency, $f_{PTj}$ are the known (in particular already mixed down) frequencies of the PT signals, and $A_j(t)$ and $B_j(t)$ describe the amplitude and offset modulations of the jth PT frequency in the sum signal.

When, for example, the PT frequency of a first PT signal (j=1) corresponds to the frequency $f_{PT1}$=0 Hz and the PT frequency of a second PT signal (j=2) to the frequency $f_{PT2}=\Delta f_{PT}$, the following model is produced:

$$A1(t) + B1(t)*\sin(2\pi*0 \text{ Hz}*t) + A2(t) + B1(t)*\sin(2\pi*\Delta f_{PT}*t)$$

In one embodiment, the specified model may be fitted by a Kalman filter, wherein $A_j$, $B_j$, and the known and fixed harmonic signal components sin $(2\pi*f_{PTj}*t)$ are parameters of the underlying model of the Kalman filter.

The Kalman filter may be applied to predicted signals during the pauses (in particular, during the emission of RF pulses by the MR apparatus) in which no PT signals are received, instead of being applied to currently measured PT signals.

The Kalman filter may operate in two modes. In a first possible mode, (i.e., "predict/correct" mode), with the aid of the signal model and its parameters fitted in the previous execution sequence, the value of the next sampling point is calculated as a prediction. Thereafter, when the sampling point has actually been measured, this prediction is corrected and where necessary parameters of the signal model are adapted (almost "to the measured reality").

In a second possible mode, (i.e., "predict" mode, a pure prediction mode), the values of the next sampling points are predicted with the aid of the last available model parameters. In this way, the signal may theoretically be extrapolated for any given time, but, e.g., at least for short periods in which no new data is received such as the pauses between the PT receive time segments. When measured values are then received again, these may be corrected and the Kalman filter operates again in the first "predict/correct" mode.

One possible form of embodiment makes provision for the specified model to be fitted for the periods of time outside the pauses in which PT signals are received, by a first Kalman filter, in particular a first extended Kalman filter, with the aid of the number of PT signals detected. Additionally, for the periods of time within the pauses in which PT signals are received, a second Kalman filter, in particular a second extended Kalman filter, is applied, which is based on a learnt and/or precalculated model, which takes account of signal distortions caused by RF pulses. This represents a possible form of a switching Kalman filter, in accordance with which a switchover is made between the first Kalman filter and the second Kalman filter.

A magnetic resonance apparatus is further proposed, which is embodied to carry out a method as described above. The advantages of the magnetic resonance apparatus correspond to the advantages of the method for detection of a number of pilot tone signals set out above in detail. Features, advantages, or alternate forms of embodiment may likewise be transferred to the other claimed subject matter and vice versa.

Such an MR apparatus may have one or more PT generators for sending of PT signals, an RF receive unit for receiving receive signals, in particular PT and MR signals, and a detection unit for detecting the number of PT signals. The MR apparatus may further have at least one unit for separation of the number of PT signals, for interpolation of the receive signals and/or for reduction of peaks in the receive signals.

A computer program product is further proposed, which includes a program and is able to be loaded directly into a memory of a programmable system control unit of an MR apparatus and program means, for example, libraries and auxiliary functions for carrying out a proposed method when the computer program product is executed in the system control unit of the MR apparatus. The computer program product in this case may include software with a source code that still has to be compiled and linked or that just has to be interpreted, or an executable software code, which, for execution, only has to be loaded into the system control unit.

The proposed method may advantageously be carried out quickly, identically, repeatably, and robustly by the computer program product. The computer program product may be configured so that it may carry out the proposed method by the system control unit. The system control unit in this case may have the preconditions in each case, such as a corresponding main memory, a corresponding graphics card, or a corresponding logic unit, so that the respective method acts may be carried out efficiently.

The computer program product may be stored on a computer-readable medium or is held on a network or a server, from where it may be loaded into the processor of a local system control unit, which is connected directly to the MR apparatus or may be embodied as part of the MR apparatus. Furthermore, control information of the computer program product may be stored on an electronically readable data medium. The control information of the electronically readable data medium may be configured in such a way that, when the data medium is used in a system control unit of an MR apparatus, it carries out a proposed method.

Examples of electronically readable data media are a DVD, a magnetic tape, or a USB stick, on which electronically readable control information, in particular software, is stored. When this control information is read from the data medium and stored in a system control unit of the MR apparatus, e.g., all proposed forms of embodiment of the method described above may be carried out.

Further advantages, features, and details of the disclosure emerge from the embodiments described below, as well with the aid of the drawings. Parts that correspond to one another are provided with the same reference numbers in all figures.

DETAILED DESCRIPTION

Figure 1:
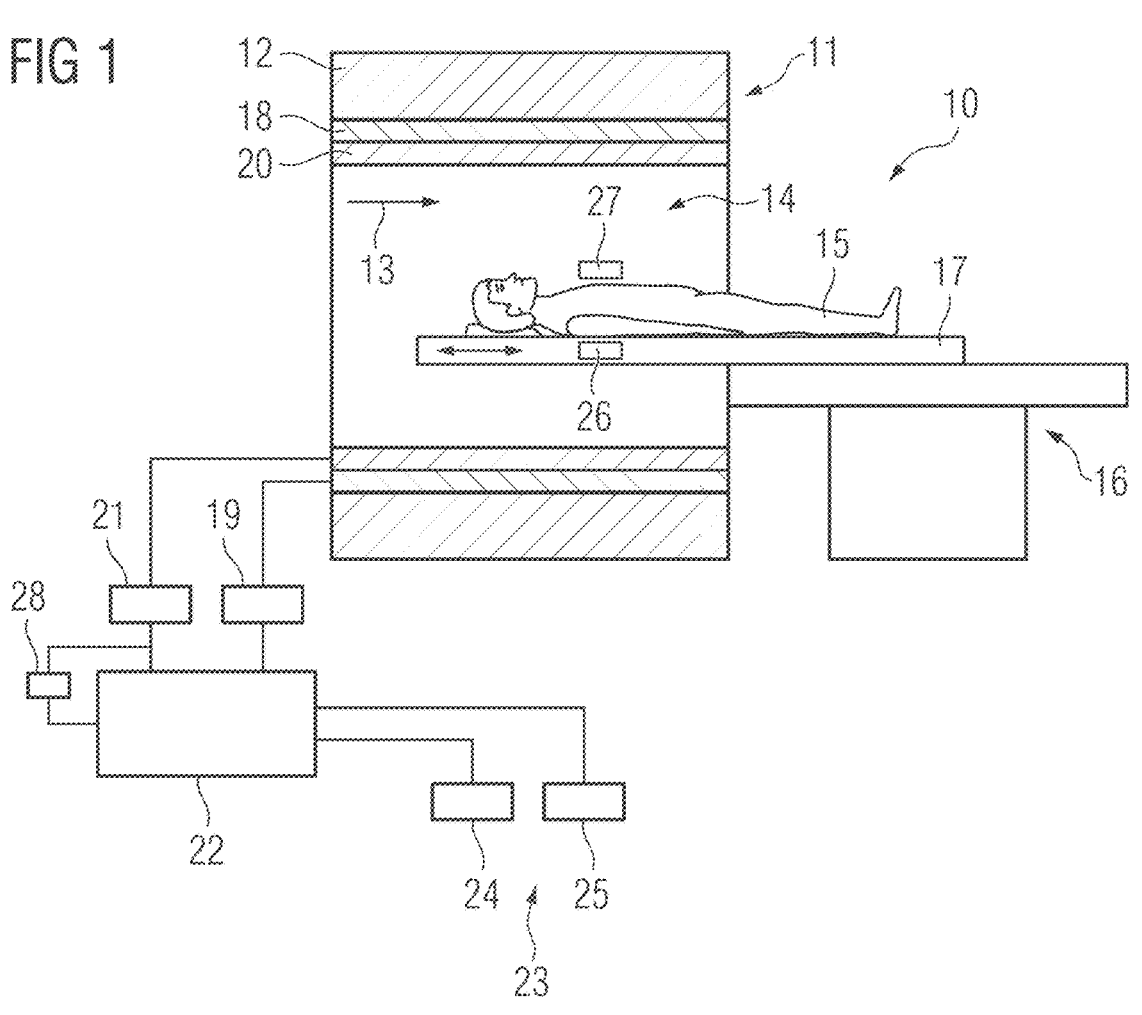
FIG. 1 depicts an example of a magnetic resonance apparatus.

Shown schematically in FIG. 1 is a magnetic resonance apparatus 10. The MR apparatus 10 includes a magnet unit 11, which has a main magnet 12 for creating a strong and in particular temporally constant main magnetic field 13. Moreover, the MR apparatus 10 has a patient receiving area 14 for accepting a patient 15. The patient receiving area 14 in the present embodiment is embodied in a cylindrical shape and surrounded in a cylindrical manner in a circumferential direction by a magnet unit 11. However, a different embodiment of the patient receiving area 14 that differs from this is also conceivable. The patient 15 may be pushed by a patient support apparatus 16 of the MR apparatus 10 in the patient receiving area 14. To this end, the patient receiving area 16 has a patient table 17 embodied movably within the patient receiving area 14.

The magnet unit 11 furthermore has a gradient coil unit 18 for creation of magnetic field gradients, which are used for a spatial encoding of MR signals during an MR measurement. The gradient coil unit 18 is controlled by a gradient control unit 19 of the MR apparatus 10. The magnet unit 11 furthermore includes a radio frequency antenna unit 20, which, in the present exemplary embodiment is embodied as an integrated body coil fixed in the MR apparatus 10. The RF antenna unit 20 is controlled by a radio frequency antenna control unit 21 of the MR apparatus 10 and couples radio-frequency pulses into an examination space, which is formed by a patient receiving area 14 of the MR apparatus 10. The main magnetic field 13 created by the main magnet 12 thereby creates a spin excitation of atomic nucleus. By relaxation of the excited atomic nuclei, magnetic resonance signals are created.

The MR apparatus 10 further includes two pilot tone generators 26, 27 for sending, in particular emitting, a PT signal in each case. It is also possible for the MR apparatus 10 to include more than two PT generators, which transmit one PT signal with a specific frequency in each case. A PT signal may be a sine-wave signal of constant frequency. The frequencies of the PT signals created by the two generators 26, 27 may differ. Through interaction of the coupled PT signals with the patient 15 the PT signals are changed. For example, a movement of the patient 15 may impress movement information onto the PT signals.

The, in particular, movement-modulated, PT signals and the MR signals may be received by a radio frequency receive unit of an MR apparatus. In the example shown, the radio frequency antenna unit 20 also functions as a radio frequency receive unit, which is configured to receive the receive signals, which as well as the MR signal, also include PT signals. Advantageously, the receive signals, in particular the MR signal and the PT signals, are received by one or a number of local coils (not shown here), i.e., the radio frequency receive unit then includes such local coils. In particular, the radio frequency antenna unit 20, in particular the radio frequency receive unit, may include a number of coil elements, which may receive the receive signals in parallel. Advantageously, no additional hardware is necessary by comparison with conventional MR apparatuses in order also to receive the PT signals as well as the MR signal.

The MR apparatus 10 further includes a detection unit 28 for detection of the PT signals from the receive signals with a detection bandwidth $B_D$. The detection unit 28 may be configured as a hardware component, which may include one or more analog to digital converters or one or a number of FPGAs. Advantageously, no greater demands have to be imposed on the hardware of the detection unit 28 for detection of a number of PT signals, in particular on a possible FPGA and/or on the layout of the detection unit 28, than on a (conventional) detection unit for detection of just one PT signal. The PT signals detected with the detection unit 28 may be transferred to the system control unit for further processing.

The MR apparatus 10 has a system control unit 22 for a control of the main magnet 12 of the gradient control unit 19 and for control of the RF antenna control unit 21. The system control unit 22 centrally controls the MR apparatus 10, such as the carrying out of a predetermined imaging MR sequence. Moreover, the system control unit 22 includes an evaluation unit not shown in any greater detail for an evaluation of the MR signal and/or of the PT signals that are detected during the magnetic resonance examination. Furthermore, the MR apparatus 10 includes a user interface 23, which is connected to the system control unit 22. Control information, such as imaging parameters, movement curves derived from the PT signals as well as reconstructed magnetic resonance images may be displayed on a visual display unit 24, (e.g., at least one monitor), of the user interface 23 for a medical operator. Furthermore, the user interface 23 has an input unit 25, by which information and/or parameters may be input during a measurement process by the medical operating personnel.

Figure 2:
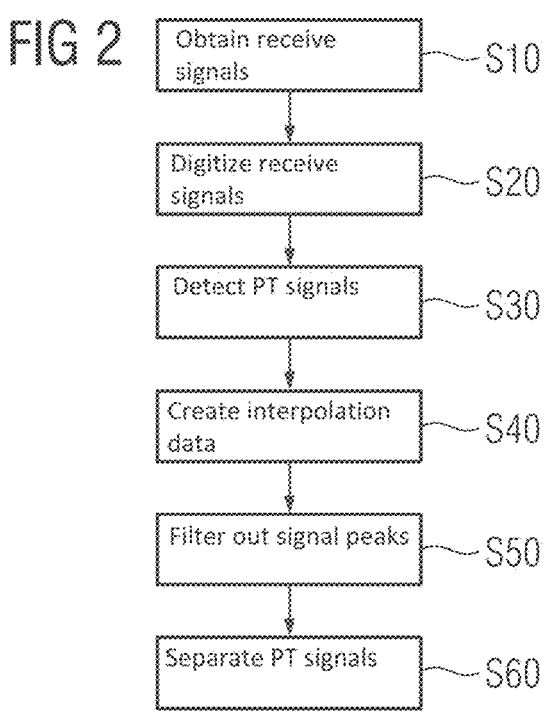
FIG. 2 depicts an example of a method for detection of a number of pilot tone signals.

Shown in FIG. 2 is a method for detection of a number of pilot tone signals. In this case, in act S10, receive signals in accordance with an MR sequence are received by an RF receive unit, here, by way of example, by the RF antenna unit 20 of the MR apparatus 10. The receive signals, as well as the MR signal, include a number of PT signals, each with a different PT frequency $f_{PTj}$, for example, the two PT signals that are emitted by the PT generators 26, 27.

Figure 3:
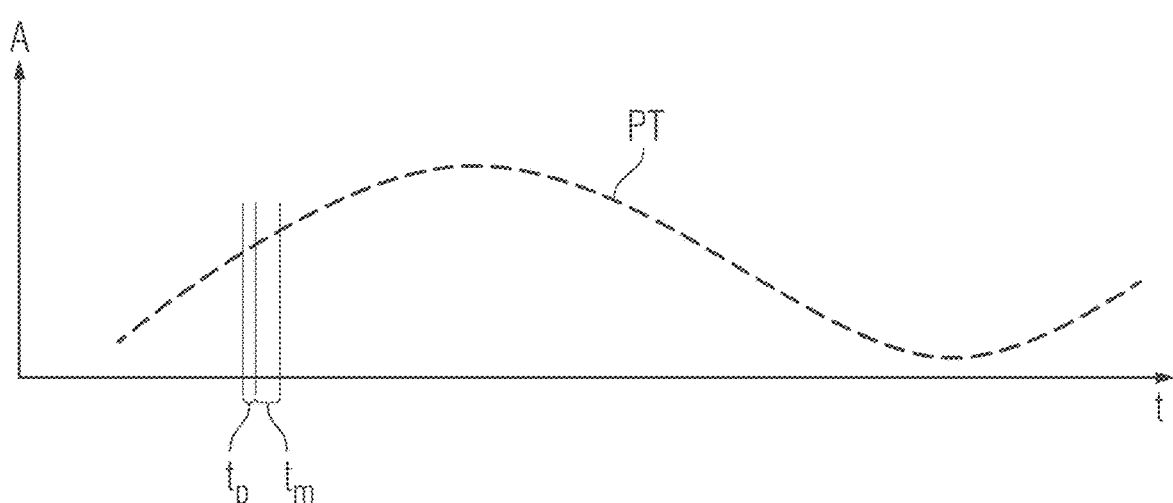
FIG. 3 depicts an example of a pilot tone signal interrupted by receive pauses.

The receipt of the number of PT signals (and, e.g., also of the MR signal) is interrupted according to the MR sequence by pauses, so that it takes place in the PT receive time segments between the pauses. This is shown by way of example in FIG. 3, which shows the timing of an amplitude A of a PT signal PT. The received PT signal PT has pauses or gaps of a duration $t_P$, so that the PT signal PT is merely received in the intervening periods of time of the period $t_m$. In the example, the periods of time $t_P$ and $t_m$ are constant over the course of the PT signal, so that the duration $t_m$ is also the shortest duration of the PT receive time segments interrupted by pauses corresponding to the MR sequence. For example, the data stream of the PT signals is regularly interrupted by the sending of RF pulses, for example, for 1 ms every 3 ms, so that there is 2 ms for a PT recording time segment.

Figure 4:
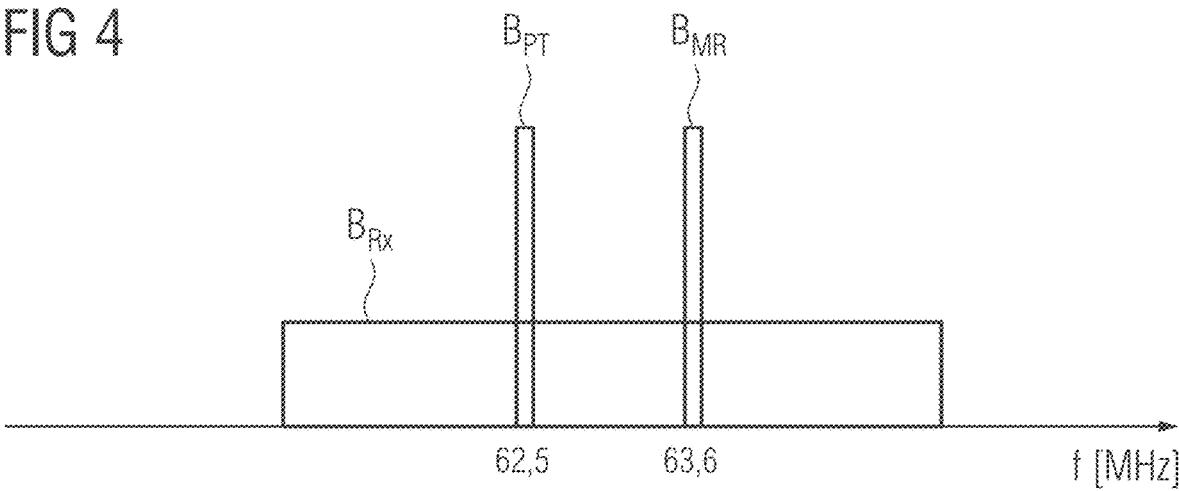
FIG. 4 depicts an example of a diagram of frequencies of the PT signals and of the MR signal within a receive frequency range of the MR apparatus.

In FIG. 4, the frequency ranges of the receive signals are shown by way of example for an MR apparatus with a main magnetic field strength of 1.5 T. The number of PT signals lie in a frequency range $FB_{PT}$ around 62.5 MH. The MR signal lies in a frequency range $B_{MR}$ around 63.6 MHZ, e.g., the Larmor frequency of protons at 1.5 T. Both frequency ranges $B_{PT}$ and $B_{MR}$ in their turn lie within the receive frequency range $B_{Rx}$, e.g., of the working range of the receive path, in particular of the frequency range that the MR apparatus, in particular the radio frequency antenna unit 20 and/or the radio frequency antenna control unit 21, is capable of receiving.

The receive signals received with the radio frequency receive unit are in particular converted to an intermediate frequency, in particular with the help of a frequency mixer.

In act S20 (cf. FIG. 2), the receive signals converted to the intermediate frequency are digitized by sampling them with a first sampling frequency $f_1$, for example, by an analog to digital converter (ADC) of the detection unit 28. This digitization may be undertaken with a first sampling frequency $f_1$ of 10 MHz or 10 MS/s (S/s: samples per second). Then a real-value spectrum of $-f_1/2$ to $f_1/2$ is initially available.

Figure 5:
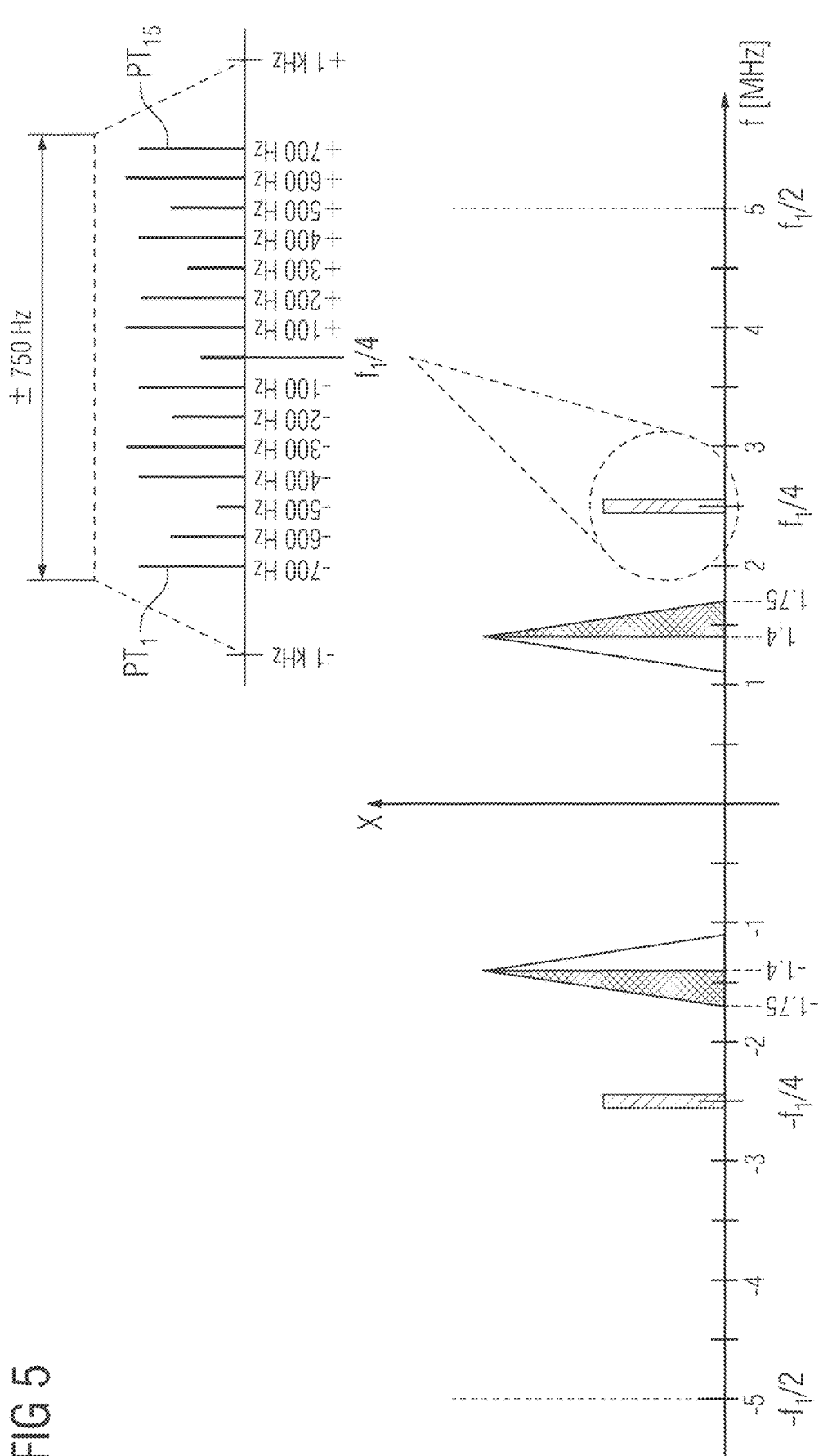
FIG. 5 depicts an example of a spectral diagram of digitized MR and PT-data.

The digitized raw data X is shown spectrally in FIG. 5. The MR signal lies here at −1.4 or +1.4 MHz and has a width of ±350 kHz. The number of PT signals lie at $-f_1/4=-2.5$ MHz or $+f_1/4=+2.5$ MHz.

Advantageously, a frequency that corresponds to a frequency close to or exactly at an odd-number multiple of $f_1/4$ is selected as PT frequency. If a corresponding PT signal arrives at an ADC input, then the PT signal, after the sampling, appears exactly at or close to the frequency $f_1/4$. Advantageously, the MR apparatus 10 is designed in such a way that none of the MR receive bands (for example, of 1H and/or other core types) include a multiple of $f_1/4$ but are sufficiently far from it.

In act S30 (cf. FIG. 2), the number of PT signals are detected from the receive signals, by the PT signals being sampled in the digitized receive signals at a second sampling frequency $f_2$. For the second sampling frequency $f_2$, the following applies: $f_2 \geq 2/t_m$ or $f_2 = 4/t_m$, wherein $t_m$ is the shortest duration $t_m$ of the number of PT recording time segments. If, for example, the duration is $t_m=2$ ms, then it amounts to the second sampling frequency $f_2$ 2 kHz or to the corresponding sampling density 2 kS/s.

This means a reduction of the original sampling density of 10 MS/s for the part of the sampled spectrum that contains the number of PT signals. What may be achieved by the condition $f_2 \geq 2/t_m$ or $f_2 \geq 4/t_m$, is that the sampling density is sufficiently large to mitigate the effects of the interruptions on receipt of the receive signals, in particular of the PT signals.

In order to detect valid PT data between the RF pulses, the time between two sampling points may be significantly shorter than the duration $t_m$ of a PT recording time segment, e.g., 2 ms. In this case, this would be 1 ms, for example (e.g., factor 2), or 0.5 ms (e.g., factor 4). The reciprocal of the time between two sampling points corresponds to the second sampling frequency $f_2$.

On the other hand, the second sampling frequency $f_2$ may also only be chosen to be as small as necessary, for example, to keep the requirements imposed on the detection hardware as small as possible. In certain examples, $f_2 \leq 80/t_m$, $f_2 \leq 40/t_m$, or $f_2 \leq 20/t_m$. Thus, the second sampling frequency $f_2$ may lie in the ranges: $2/t_m \leq f_2 \leq 80/t_m$; $2/t_m \leq f_2 \leq 40/t_m$; $2/t_m \leq f_2 \leq 20/t_m$; $4/t_m \leq f_2 \leq 80/t_m$; $4/t_m \leq f_2 \leq 40/t_m$; or $4/t_m \leq f_2 \leq 20/t_m$.

Figure 6:
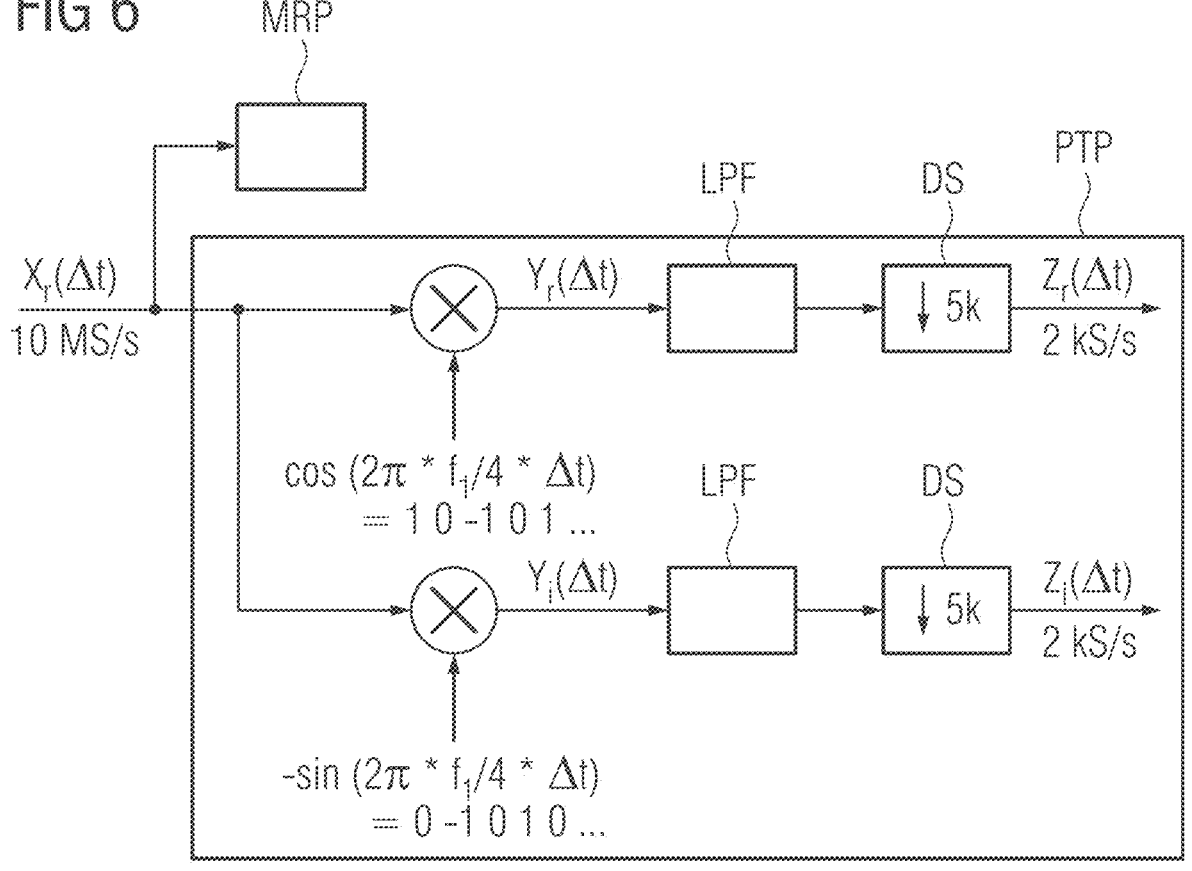
FIG. 6 depicts an example of a processing path for processing the PT signals.
Figure 7:
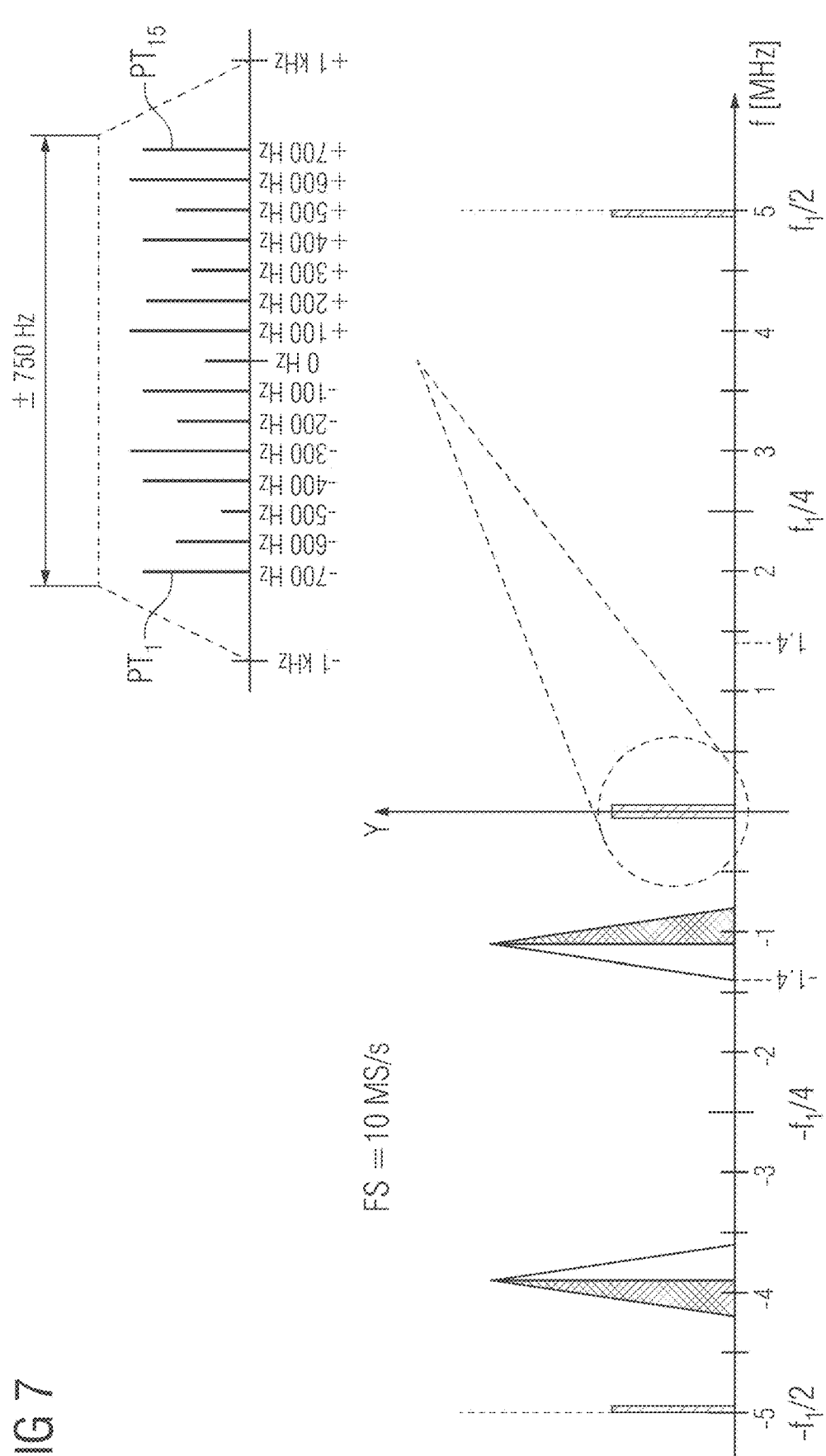
FIG. 7 depicts an example of a spectral diagram of complex MR and PT data before lowpass filtering of the PT data.
Figure 8:
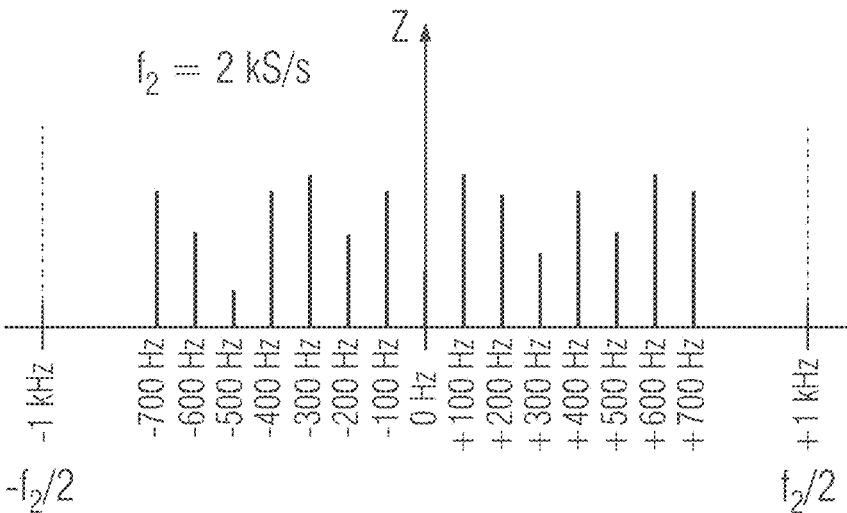
FIG. 8 depicts an example of a spectral diagram of PT data after a decimation to a lower spectral sampling rate.

The detection of the number of PT signals from the receive signals in act S30 are explained in greater detail with the aid of FIG. 6-8. In accordance with FIG. 6, the digitized raw data $X_r(\Delta t)$ is further processed immediately or after one or a number of common decimation acts, beyond the ADC into two signal paths, one MR path MRP and one PT path PTP. The MR signal processing is undertaken in the MRP in the usual way. The number of PT signals are spectrally shifted in a "half complex mixer" in such a way that they come to lie symmetrically around 0 Hz. The result of this operation is a real component $Y_r(\Delta t)$ and an imaginary component $Y_r(\Delta t)$. The spectral location of the shifted signals Y is shown in FIG. 7.

Subsequently, the signals are lowpass filtered with lowpass filtering LPF and decimated by the factor of 5000 from 10 MS/s to 2 kS/s data rates. A complex sampling value of the 2 kHz-datastream is created by the 10 MHz data stream being multiplied by the periodic data sequences |: 0, −1, 0, 1: | (real part) and |: 1, 0, −1, 0: | (imaginary part). Advantageously, in one possible realization a "true," complicated multiplication is not involved, but this is restricted to simple leading sign manipulation and zero setting.

The number of PT signals are then available as one complex signal with 2 kS/s with a baseband of −1 kHz to 1 kHz. Due to the filter flanks of the decimation filter DS, around ±750 Hz thereof may be used. The resulting spectral distribution of the sum signal Z of the number of PT signals is shown in FIG. 8.

Uncompensated non-linearities in the RF receive unit may create harmonic and intermodulation products of the PT signals PT1, PT2 and thereby causes convolution and intermodulation artifacts in the MR signal, when they fall after sampling into the frequency spectrum of the MR signal. The frequencies of the PT signals or of the PT generators 26, 27 may be chosen so that harmonics and also intermodulation products that have a high amplitude do not fall into the MR receive band $B_{MR}$. It may be allowed in any case that only harmonics and intermodulation products with sufficiently small amplitude fall into this MR receive band $B_{MR}$. Advantageously convolution artifacts may be reduced thereby.

Figure 9:
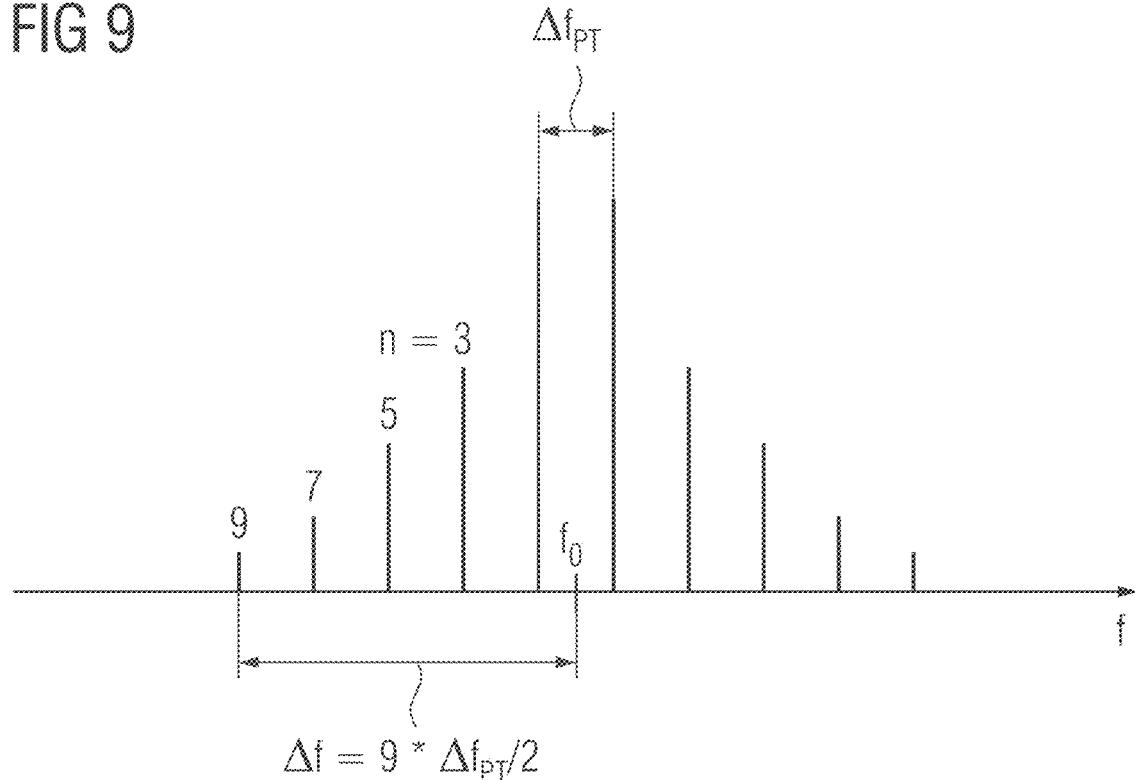
FIG. 9 depicts an example of a spectral diagram of intermodulation signals of the PT signals.
Figure 10:
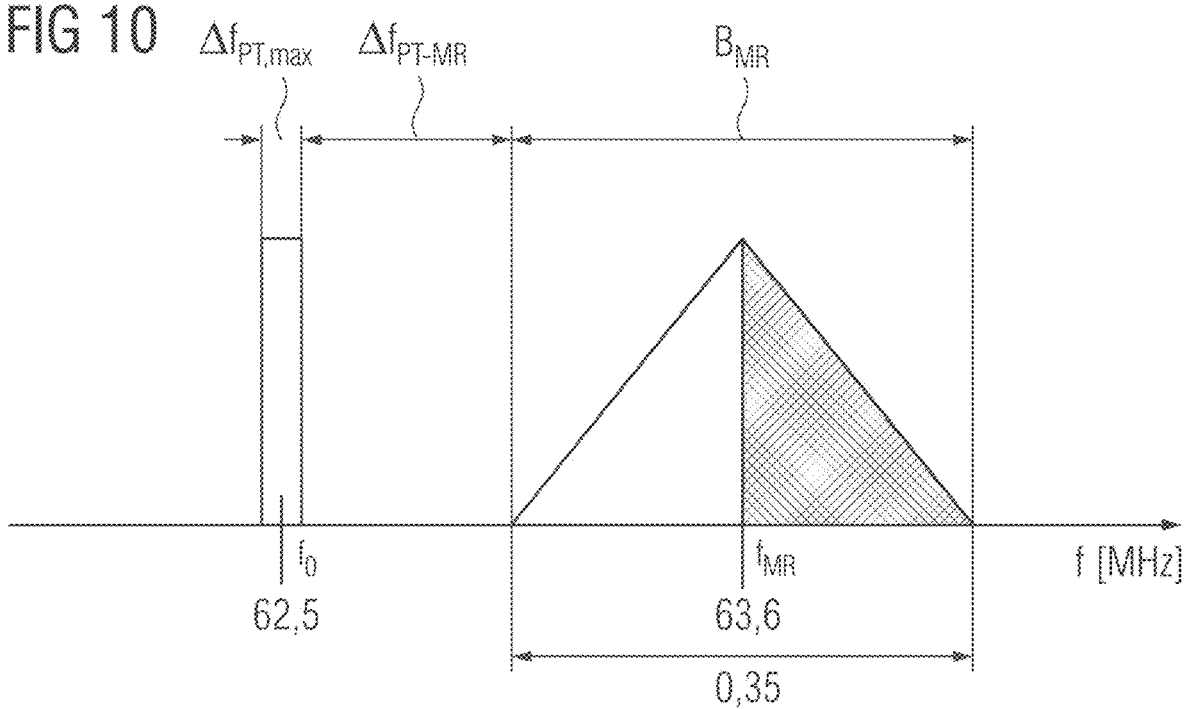
FIG. 10 depicts an example of a diagram of a relative spectral spacing between the PT signals and the MR signal.

The individual PT signals PTj may intermodulate to potentially existing non-linearities of the receive path. Here, inter alia, products may arise from odd-number order intermodulation (n=3, 5, 7, . . . ), which fall spectrally close to, symmetrically around the pilot tone signals involved. The frequency spacings between the mid frequency $f_0$, around which the number of pilot tone frequencies are arranged symmetrically, and the individual intermodulation products grow with the frequency spacing of the two PT signals $\Delta f_{PT}$ involved and the ordinal number n of the causative intermodulation process. This is illustrated in FIG. 9. For an unfavorably large maximum pilot tone frequency spacing $\Delta f_{PT,max}$ selected, relevant intermodulation products extend spectrally into the MR receive band. (In the example shown in FIG. 5, these are the maximally spaced PT signals PT15 and PT1 in respect of the frequency, so that here the maximum frequency spacing of the pilot tone signals amounts to $\Delta f_{PT,max}=f_{PT15}-f_{PT1}=700$ Hz–(−700 Hz)=1.4 kHz.) This is avoided by the choice of a sufficiently small (maximum) pilot tone frequency spacing and also a sufficiently large frequency spacing between the pilot tone frequencies and the next MR signal band boundary. This relationship is shown in FIG. 10.

The ordinal number of the intermodulation, products of which fall computationally into the MR receive band, is large enough for the level of the intermodulation products arising from it to remain sufficiently small. This specification is advantageously fulfilled for ordinal numbers of ≥80, in particular 90, in particular 100. From this condition a specification is produced for the maximum frequency spacing of the pilot tone signals $\Delta f_{PT,max}$:

$$\Delta f_{PT,max} < 2 * \Delta f_{PT-MR}/n_{max} = 2 * (f_{MR} - B_{MR}/2 - f_0)/n_{max}$$

With a tolerated maximum ordinal number $n_{max}$ of 100, the following is produced for the example given above:

$$\Delta f_{PT,max} < 2 * (63,6 - 0,35/2 - 62.5) \text{MHz}/100 = 18,5 \text{ kHz}$$

This requirement is markedly behind the maximum frequency spacing produced from the sampling rate $f_2$.

In act S40 of the method in accordance with the diagram in FIG. 2, there is interpolation over the pauses of the receipt of the number of pilot tone signals interrupting the pilot tone receive time segments. In particular, additional interpolation data is created, which is assigned to the pause periods.

The interpolation is in particular promising when the PT signal as a rule only changes minimally in the period of time of the pauses. Such an interpolation may be carried out in particular by a Kalman filter.

In S50 of the method in accordance with the diagram in FIG. 2, signal peaks are filtered out from the receive signals and/or from the number of pilot tone signals detected. The filtering-out, for example, includes learning and subtraction of the shape of the signal peaks.

Figure 11:
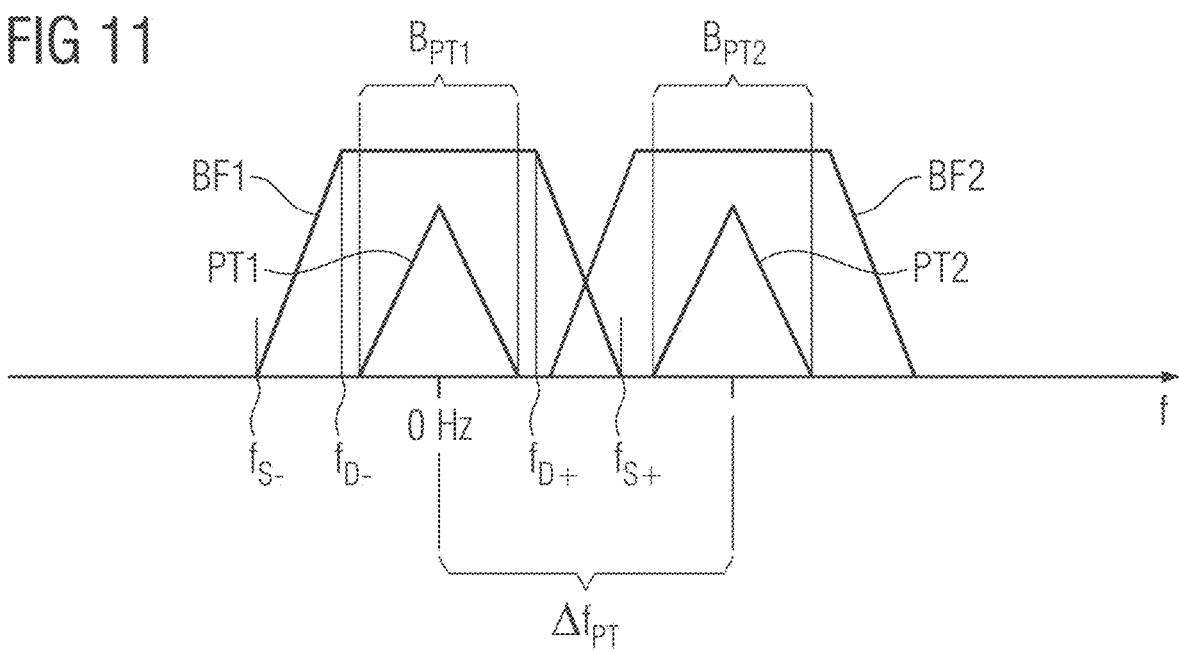
FIG. 11 depicts an example of a diagram of bandpass filtering for filtering PT signals.

In act S60 of the method in accordance with the diagram in FIG. 2, the number of PT signals (for example, the PT signals PT1 and PT2 in accordance with FIG. 4) are separated by a bandpass filter in each case. (A further possibility includes a frequency conversion to 0 Hz with subsequent lowpass filtering). The separation is explained in greater detail with the help of FIG. 11. Plotted on the horizontal axis is the frequency f. The PT signal PT1 with the frequency spectrum $B_{PT1}$ and the PT signal PT2 with the frequency spectrum $B_{PT2}$ are shown by way of example. With the aid of the PT signal PT1, the separation, in particular filtering, by a bandpass filter is explained below. This explanation may readily also be transferred to the separation of the PT signal PT2.

The PT signal PT1 has a bandwidth $B_{PT1}$. The bandpass filter BF1 has two blocking bands, namely a first blocking band up to frequency $f_{S-}$ and a second blocking band as from frequency $f_{S+}$. Moreover, the bandpass filter BF1 has a pass band, which is limited by the frequencies $f_{D-}$ and $f_{D+}$. Between the frequencies $f_{S-}$ and $f_{D-}$, the bandpass filter BF1 has a first transition band. Between the frequencies $f_{S+}$ and $f_{D+}$, the bandpass filter BF1 has a second transition band. The blocking band that begins at the frequency $f_{S+}$t, overlaps with the frequency spectrum $B_{PT2}$ of the PT signal PT2. Advantageously, the signal filtered in this way merely includes the PT signal PT1, so that the PT signal PT1 is separated from the PT signal PT2.

The physiological frequency content of a PT signal may be created by a body mass of the patient moving. Therefore this frequency content may have a bandwidth of only a few Hz, for example, <0.5 Hz for a breathing movement and <6 Hz for a heart movement. Accordingly, the PT signal may be filtered with a narrow bandpass filter of less than 100 Hz without valuable information being lost thereby. Possible bandwidths, in particular of the pass band of the bandpass filter, would be 50 or 10 Hz, for example. The group run time produced by the bandpass filter sets the width of the bandpass filter to a lower limit.

A number of PT generators 26, 27 may be used in order to carry out the method shown in FIG. 2. Each of the PT generators 26, 27 sends out a PT signal, which may lie within a frequency band, which is suitable for fulfilling the condition: $\Delta f_{PT,max}<2*\Delta f_{PT-MR}/n_{max}=2*(f_{MR}-B_{MR}/2-f_0)/n_{max}$ explained above, wherein $n_{max}$=80, 90, or 100.

The spacing between the frequencies of the PT signals PT1, PT2 may further be greater than the width of the bandpass filter or lowpass filter for separation of the PT signals PT1, PT2. The detection unit 28, which is embodied in particular as digital receive hardware, may detect the overlaying of the PT signals PT1, PT2.

The order of acts S40, S50, and S60 may also be arranged differently from the way shown in FIG. 2, for example, in accordance with the order: S50, S40, S60; or S50, S60, S40; or S40, S60, S50; or S60, S40, S50; or S60, S50, S40. For example, the data flow of the receive signals may initially be corrected in respect of the signal gaps in periods of time $t_P$ in accordance with act S40 and in respect of the signal peaks in accordance with S50. Thereafter, the PT signals PT1, PT2 may be separated in accordance with act S30 by bandpass filtering and/or lowpass filtering.

When a bandpass filter is used, each bandpass filter BF1, BF2 may be centered on a different PT frequency $f_{PT1}$, $f_{PT2}$. The output of each bandpass filter BF1, BF2 may be treated as a separate set of receive channels for the further working, in particular processing, of the PT signals PT1, PT2, for example, for calculation and application of channel combination coefficients or RF mitigation.

It is further conceivable for acts S30, S40 to be combined into one act and/or process. For example, the separation of the PT signals in accordance with act S30 and the interpolation in accordance with act S40 may be combined, so that the interpolation and the separation occurs at the same time. Then, in an act following thereafter, there may be a suppression of disruptive signal peaks in accordance with act S50.

A possible implementation for a combined gap interpolation in accordance with act S40 and a bandpass filtering in accordance with act S30 may include a use of a Kalman filter as lowpass filter on complex data values. The processing of complex-value data may be undertaken by two independent Kalman filters for real or imaginary part or by the use of a complex-value signal model.

The received j PT signals PTj may further each be described by models as one harmonic signal with a fixed and known frequency $f_{PTj}$, that has a time-dependent physiological modulation in offset $A_j(t)$ and amplitude $B_j(t)$ in accordance with $PT_j = A_j(t) + B_j(t) \cdot \sin(2\pi \cdot f_{PTj} \cdot t)$.

In accordance with a possible form of embodiment, this model may be fitted with the help of a Kalman filter, in particular of an extended Kalman filter, with the parameters $A_j(t)$ and $B_j(t)$, wherein the harmonic signals $\sin(2\pi \cdot f_{PTj} \cdot t)$ are fixed. During the pauses or gaps in the periods of time $t_P$, the input of the signal into this Kalman filter may also be interrupted. Instead, in these periods of time $t_P$, for example, a prediction mode may be applied.

In accordance with a further possible form of embodiment, the signals PTj may be fitted by two Kalman filters, in particular extended Kalman filters. In this case, a first such filter is applied in the periods of time $t_m$ and a second such filter in the periods of time $t_P$, in which, for example, an RF pulse is being output by the MR apparatus 10. A switchover is thus performed between two Kalman filters, in particular extended Kalman filters, (switching Kalman filter). The second filter may be based on a trained and/or precalculated model, which takes into account distortions of the PT signals due to RF pulses output by the MR apparatus 10.

The Kalman filter or extended Kalman filter mentioned may be realized by similar stochastic filter techniques, such as unscented Kalman filters or particle filters.

In conclusion, it is pointed out once again that the method described in detail above as well as the MR apparatus shown, merely involve exemplary embodiments, which may be modified in a wide variety of ways by the person skilled in the art, without departing from the field of the disclosure. Furthermore the use of the indefinite article "a" or "an" does not exclude the features involved also being able to be present more than once. Likewise the term "unit" does not exclude the components involved include a number of interacting subcomponents, which where necessary may also be spatially distributed.

The invention claimed is:

1. A method for detection of a number of pilot tone signals, wherein the method comprises:
   receiving, by a radio frequency receive unit of a magnetic resonance apparatus, receive signals in accordance with a magnetic resonance sequence, wherein the receive signals comprise a magnetic resonance (MR) signal and the number of pilot tone signals, wherein the number of pilot tone signals have a different pilot tone frequency in each case, and wherein the number of pilot tone signals are received according to the magnetic resonance sequence in a number of pilot tone receive time segments interrupted by pauses, which each have a duration;
   digitizing the receive signals by sampling with a first sampling frequency $f_1$; and
   detecting the number of pilot tone signals from the digitized receive signals by sampling the digitized receive signals with a second sampling frequency $f_2$, wherein $f_2 \geq 2/t_m$, wherein $t_m$ is a shortest duration of the number of pilot tone recording time segments.

2. The method of claim 1, wherein $f_2 \geq 4/t_m$.

3. The method of claim 1, wherein $f_2 \leq 80/t_m$.

4. The method of claim 1, wherein $f_2 \leq 40/t_m$.

5. The method of claim 1, wherein $f_2 \leq 20/t_m$.

6. The method of claim 1, wherein the MR signal lies in an MR frequency range $f_{MR} \pm \Delta f_{MR}$,
   wherein the number of pilot tone frequencies $f_{PTj}$ have a maximum spacing of $\Delta f_{PT,max}$ from one another,
   wherein the number of pilot tone frequencies $f_{PTj}$ have a minimum spacing of $\Delta f_{PT\text{-}MR}$ MR from the frequency range $f_{MR} \pm \Delta f_{MR}$, and
   wherein $\Delta f_{PT,max} < 2 * \Delta f_{PT\text{-}MR}/n_{max}$, where $n_{max} = 80$.

7. The method of claim 1, wherein the number of pilot tone frequencies are arranged symmetrically around a mid-frequency $f_0$, and
   wherein $f_0 = f_1/4$.

8. The method of claim 1, further comprising:
   separating the number of pilot tone signals by a bandpass filter in each case.

9. The method of claim 1, further comprising:
   separating the number of pilot tone signals by a frequency conversion of a respective pilot tone signal to 0 Hz and a subsequent lowpass filtering.

10. The method of claim 1, further comprising:
    interpolating over the pauses interrupting the pilot tone receive time segments of the receiving of the number of pilot tone signals.

11. The method of claim 10, further comprising:
    separating the number of pilot tone signals by a bandpass filter or by a frequency conversion of a respective pilot tone signal to 0 Hz and a subsequent lowpass filtering, wherein the interpolating is undertaken together with and/or after the separating of the number of pilot tone signals.

12. The method of claim 11, wherein the separating and/or the interpolating comprises an application of a Kalman filter and/or of a particle filter.

13. The method of claim 12, wherein the Kalman filter is an extended Kalman filter, a switching Kalman filter, and/or an unscented Kalman filter.

14. The method of claim 11, wherein the separating and the interpolating are undertaken by application of a Kalman filter.

15. The method of claim 1, further comprising:
    filtering out signal peaks from the receive signals and/or from the number of pilot tone signals detected.

16. The method of claim 15, wherein a filter that is based on a trained and/or precomputed model is used for the filtering out of the signal peaks.

17. A non-transitory computer readable medium comprising a computer program product and is configured to be loaded directly into a memory of a programmable system control unit of a magnetic resonance apparatus, wherein the program, when executed by the programmable system control unit, is configured to cause the magnetic resonance apparatus to:

receive, by a radio frequency receive unit of the magnetic resonance apparatus, receive signals in accordance with a magnetic resonance sequence, wherein the receive signals comprise a magnetic resonance signal and a number of pilot tone signals, wherein the number of pilot tone signals have a different pilot tone frequency in each case, and wherein the number of pilot tone signals are received according to the magnetic resonance sequence in a number of pilot tone receive time segments interrupted by pauses, which each have a duration;

digitize the receive signals by sampling with a first sampling frequency $f_1$;

detect the number of pilot tone signals from the digitized receive signals by sampling the digitized receive signals with a second sampling frequency $f_2$, wherein $f_2 \geq 2/t_m$, wherein $t_m$ is a shortest duration of the number of pilot tone recording time segments; and separate the number of pilot tone signals by a bandpass filter or by a frequency conversion of a respective pilot tone signal to 0 Hz and a subsequent lowpass filtering; and/or interpolate over the pauses interrupting the pilot tone receive time segments of the receipt of the number of pilot tone signals.

18. A magnetic resonance apparatus comprising:

a radio frequency receive unit configured to receive, in accordance with a magnetic resonance sequence, receive signals, wherein the receive signals comprise a magnetic resonance signal and a number of pilot tone signals, wherein the number of pilot tone signals have a different pilot tone frequency in each case, and wherein the number of pilot tone signals are received according to the magnetic resonance sequence in a number of pilot tone receive time segments interrupted by pauses, which each have a duration; and a control unit configured to:

digitize the receive signals by sampling with a first sampling frequency $f_1$; and detect the number of pilot tone signals from the digitized receive signals by sampling the digitized receive signals with a second sampling frequency $f_2$, wherein $f_2 \geq 2/t_m$, wherein $t_m$ is a shortest duration of the number of pilot tone recording time segments.

* * * * *